(12) United States Patent
Ko et al.

(10) Patent No.: US 7,567,426 B2
(45) Date of Patent: Jul. 28, 2009

(54) POLYMER-CERAMIC DIELECTRIC COMPOSITION, EMBEDDED CAPACITOR USING THE DIELECTRIC COMPOSITION AND PRINTED CIRCUIT BOARD HAVING THE CAPACITOR EMBEDDED THEREIN

(75) Inventors: Min Ji Ko, Kyungki-do (KR); Eun Tae Park, Kyungki-do (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 208 days.

(21) Appl. No.: 11/590,800

(22) Filed: Nov. 1, 2006

(65) Prior Publication Data
US 2007/0097597 A1    May 3, 2007

(30) Foreign Application Priority Data
Nov. 2, 2005    (KR)    .............. 10-2005-0104336

(51) Int. Cl.
*H01G 4/06*    (2006.01)
(52) U.S. Cl. ............... 361/321.2; 361/321.1; 361/311; 361/313; 361/321.4; 361/321.5
(58) Field of Classification Search ......... 361/311–313, 361/321.1, 321.2, 303, 306.3, 321.4, 321.5; 252/570, 572; 501/134, 136
See application file for complete search history.

(56) References Cited

U.S. PATENT DOCUMENTS

| | | | |
|---|---|---|---|
| 5,079,069 A | 1/1992 | Howard et al. | |
| 5,261,153 A | 11/1993 | Lucas | |
| 5,800,575 A | 9/1998 | Lucas | |
| 6,068,782 A * | 5/2000 | Brandt et al. | ............... 216/17 |
| 6,268,054 B1 | 7/2001 | Costantino et al. | |
| 6,514,894 B1 * | 2/2003 | Adair et al. | ............... 501/134 |
| 6,525,922 B2 * | 2/2003 | Winer et al. | ............. 361/306.3 |
| 6,661,642 B2 * | 12/2003 | Allen et al. | ............... 361/312 |
| 6,673,274 B2 * | 1/2004 | Venigalla et al. | ........... 252/570 |
| 6,797,413 B2 | 9/2004 | Takeishi et al. | |
| 7,092,237 B2 * | 8/2006 | Lee et al. | ................... 361/311 |
| 2002/0040085 A1 | 4/2002 | Venigalla et al. | |

FOREIGN PATENT DOCUMENTS

| | | |
|---|---|---|
| CN | 1252782 | 5/2000 |
| KR | 1997-0001260 | 1/1997 |
| KR | 2001-0109327 | 8/2001 |
| WO | WO 98/35920 | 8/1998 |
| WO | WO 02/71970 A1 | 1/2002 |

OTHER PUBLICATIONS

Chinese Office Action, with English Translation, issued in Chinese Patent Application No. CN 200610138014.5, dated Dec. 19, 2008.

* cited by examiner

*Primary Examiner*—Nguyen T Ha
(74) *Attorney, Agent, or Firm*—McDermott Will & Emery LLP

(57) ABSTRACT

Disclosed herein is a polymer-ceramic dielectric composition. The dielectric composition comprises a polymer and a ceramic dispersed in the polymer wherein the ceramic is composed of a material having a perovskite structure represented by $ABO_3$ and a metal oxide dopant and has an electrically charged surface. According to the dielectric composition, the surface of the ceramic is electrically charged to induce space-charge polarization (or interfacial polarization) at the polymer/ceramic interface, resulting in an increase in dielectric constant. Since the dielectric composition has a high dielectric constant particularly in a low-frequency range, it can be suitably used to produce decoupling capacitors.

45 Claims, 2 Drawing Sheets

POLYMER-CERAMIC DIELECTRIC COMPOSITION, EMBEDDED CAPACITOR USING THE DIELECTRIC COMPOSITION AND PRINTED CIRCUIT BOARD HAVING THE CAPACITOR EMBEDDED THEREIN

BACKGROUND OF THE INVENTION

RELATED APPLICATIONS

The present application is based on, and claims priority from, Korean Application Number 2005-104336 filed on Nov. 2, 2005, the disclosure of which is incorporated by reference herein in its entirety.

1. Field of the Invention

The present invention relates to a polymer-ceramic dielectric composition, an embedded capacitor using the dielectric composition, and a printed circuit board having the capacitor embedded therein. More specifically, the present invention relates to a polymer-ceramic dielectric composition that can ensure a high dielectric constant due to interfacial polarization, which serves to electrically charge the surface of the ceramic, and a capacitor and a printed circuit board that use the dielectric composition.

2. Description of the Related Art

Various kinds of passive elements mounted on printed circuit boards are becoming great obstacles in the miniaturization of final products. Particularly, as semiconductor active elements are embedded and the number of input/output terminals in semiconductor active elements is increasing, it is required to ensure sufficient spaces to accommodate as many passive elements as possible in the vicinity of active elements.

Capacitors are representative passive elements. It is advantageous to arrange capacitors as closely as possible to input terminals so that low inductance of the capacitors is achieved at a high operating frequency.

To satisfy the requirements for miniaturization and low inductance at a high frequency, research on embedded capacitors is now being actively undertaken. Printed circuit boards having capacitors embedded therein can contribute to a marked decrease in the size of final products. In addition, since embedded capacitors can be arranged at short distances from active elements, the length of lines is minimized so that inductance can be greatly reduced and high-frequency noise can be advantageously removed.

Representative embedded capacitors were proposed in U.S. Pat. Nos. 5,079,069, 5,261,153 and 5,800,575, all of which were filed by Sanmina, U.S.A. The embedded capacitors are produced by introducing an additional dielectric layer with capacitor characteristics into an inner layer of a printed circuit board (PCB). It is known that the capacitor characteristics of the dielectric layer are realized even when a PCB material known as FR4 is used. It is also known that the dielectric layer can be formed using a polymer-ceramic dielectric composition in order to achieve the desired capacitance.

The dielectric constant of a polymer-ceramic dielectric composition is influenced by the dielectric constant of the polymer acting as a matrix of the dielectric composition because the polymer has a relatively low dielectric constant when compared to the ceramic. Accordingly, the proportion of a ceramic powder must be increased in order to produce a dielectric material having a high dielectric constant.

In this connection, Cabot Corporation suggested polymer matrix composite in which 60 to 95% of a barium titanate-based ceramic is dispersed in a polymer (see, U.S. Patent Publication No. 2002-0040085).

However, as the proportion of the ceramic powder increases, the adhesion of a dielectric layer to metal foils is deteriorated, causing the limitation of poor processing characteristics of a printed circuit board.

On the other hand, U.S. Patent Publication No. 2002-0040085 teaches that metal oxides, such as Zr, Hf, Nb, Ca, La and Bi oxides, can be coated on the surface of the barium titanate ($BaTiO_3$)-based ceramic to improve the mechanical and electrical properties of the polymer matrix composite. No specific mention about the functions and amounts of the metals added is made in the patent publication, stating that the detailed explanations are given in U.S. Pat. No. 6,268,054 (U.S. patent application Ser. No. 08/923,680 (1997)), which was filed by Cabot Corporation.

U.S. Pat. No. 6,268,054 relates to a multilayer ceramic chip (MLCC) using a ceramic as a dielectric. This patent states that metal oxides, such as Zr, Hf, Nb, Ca, La and Bi oxides, are coated on a $BaTiO_3$-based ceramic on the basis of enhancement imparted to the processing or properties of MLCCs. The most specific description regarding the metal oxides is that when ceramic capacitors with X7R dielectric properties are desired, it is useful to provide barium titanate particles with dopants such as niobium oxide, tantalum oxide or neodymium oxide in combination with nickel oxide or cobalt oxide.

That is, it is believed that the metals are added to coat the $BaTiO_3$-based ceramic for the purpose of improving the temperature characteristics of the ferroelectric. The paraelectric, such as the metal oxide, surrounds the surface of the $BaTiO_3$-based ferroelectric to form a core-cell structure, thus ensuring capacitance characteristics with varying temperature in the MLCC.

In conclusion, Cabot Corporation intended to apply the $BaTiO_3$-based ceramic used in the MLCC to the field of polymer-ceramic dielectrics.

However, although the ceramic used in the MLCC is applied to a polymer-ceramic dielectric, there is little or no change in the dielectric constant of the dielectric material. Since the dielectric constant of a polymer-ceramic dielectric is dependent upon that of the polymer, an improvement in the dielectric constant of the composite cannot be achieved simply by increasing the dielectric constant of the ceramic powder. As shown in FIG. 1, although the dielectric constant of a ceramic material is increased by 100 times or more, there is no great change in the dielectric constant of polymer-ceramic dielectrics comprising the ceramic material. That is, it is apparent from the graph of FIG. 1 that the dielectric constant of polymer-ceramic dielectric compositions depends upon that of the polymer having a relatively low dielectric constant. Consequently, the content of the ceramic must be increased to 60-95% in order to improve the dielectric constant of the polymer-ceramic dielectrics, as taught in U.S. Patent Publication No. 2002-0040085 filed by Cabot Corporation.

SUMMARY OF THE INVENTION

It is one object of the present invention to provide a polymer-ceramic dielectric composition in which the dielectric constant of a ceramic powder can be increased.

It is another object of the present invention to provide a capacitor and a printed circuit board that use the dielectric composition.

In accordance with one aspect of the present invention for achieving the above objects, there is provided a polymer-ceramic dielectric composition comprising a polymer and a ceramic dispersed in the polymer wherein the ceramic is composed of a material having a perovskite structure represented by $ABO_3$ and a metal oxide dopant and has an electrically charged surface.

The metal of the metal oxide dopant has a different valence from the B site element of the $ABO_3$. $BaTiO_3$ is the most representative example of the $ABO_3$. The metal of the metal oxide dopant has a valence other than +4, and may be selected from the group consisting of Nb, Sb, La, Y and Mn. Mn oxide may also be used as the metal oxide dopant because it has a valence of +4 at room temperature but its valence is changed to +3 at high temperature.

In an embodiment, the polymer-ceramic dielectric composition of the present invention comprises a polymer and a ceramic dispersed in the polymer wherein the ceramic is composed of $BaTi_3$ and 0.05 to 2 mol % of Nb oxide.

In a further embodiment, the polymer-ceramic dielectric composition of the present invention comprises a polymer and a ceramic dispersed in the polymer wherein the ceramic is composed of $BaTi_3$, 0.05 to 10 mol % of Nb oxide and 0.05 to 10 mol % of Ca oxide.

When Nb oxide and Ca oxide are added as metal oxide dopants, the ratio Nb oxide/Ca oxide is preferably from 1.3 to 4.

The ceramic is primarily calcined at 800 to 1,400° C., and optionally, baked at 1,000° C. or higher.

The ceramic of the polymer-ceramic dielectric composition according to the present invention has an electrically charged surface.

In accordance with another aspect of the present invention, there is provided an embedded capacitor comprising a first electrode film, a second electrode film and a dielectric layer wherein the dielectric layer is formed of the polymer-ceramic dielectric composition.

That is, the embedded capacitor of the present invention comprises a first electrode film, a second electrode film and a dielectric layer wherein the dielectric layer is formed of a polymer-ceramic dielectric composition comprising a polymer and a ceramic dispersed in the polymer, and the ceramic is composed of a material having a perovskite structure represented by $ABO_3$ and a metal oxide dopant and has an electrically charged surface.

In an embodiment, the embedded capacitor of the present invention comprises a first electrode film, a second electrode film and a dielectric layer wherein the dielectric layer is formed of a polymer-ceramic dielectric composition comprising a polymer and a ceramic dispersed in the polymer, and the ceramic is composed of $BaTi_3$ and 0.05 to 2 mol % of Nb oxide.

In a further embodiment, the embedded capacitor of the present invention comprises a first electrode film, a second electrode film and a dielectric layer wherein the dielectric layer is formed of a polymer-ceramic dielectric composition comprising a polymer and a ceramic dispersed in the polymer, and the ceramic is composed of $BaTi_3$, 0.05 to 10 mol % of Nb oxide and 0.05 to 10 mol % of Ca oxide.

The ceramic of the polymer-ceramic dielectric composition according to the present invention has an electrically charged surface.

In accordance with yet another aspect of the present invention, there is provided a printed circuit board comprising the capacitor embedded therein.

The polymer-ceramic dielectric composition of the present invention preferably comprises 10 to 70 vol % of the ceramic and the balance of the polymer, more preferably comprises 15 to 55 vol % of the ceramic and the balance of the polymer, and most preferably comprises 20 to 55 vol % of the ceramic and the balance of the polymer.

Any polymer that is used to produce embedded capacitors may be used in the dielectric composition of the present invention. The polymer is selected from the group consisting of epoxy, polyimide, polycarbonate, polyethylene, polyethylene terephthalate, polypropylene, polystyrene, polyphenylene oxide, polyester, polyamide, and mixtures thereof.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in detail.

It has been found through experiments that when ceramics for use in MLCCs are applied to polymer-ceramic dielectrics, the dielectric constant of the polymer-ceramic dielectrics is decreased. Based on this experimental finding, the present invention has been achieved through design of new components inducing interfacial polarization in ferroelectrics. An explanation of the design of new components will be provided based on the following experimental results.

Table 1 shows the compositions of ceramics (X5R and X7R) for use in MLCCs, and Table 2 shows the electrical properties of dielectric compositions, each of which comprises 15 vol % of X5R and X7R and the balance of a polymer. For comparison, the electrical properties of a $BaTiO_3$ powder were measured under the same conditions as in the dielectric compositions, and the results are shown in Table 2.

TABLE 1

| Moles | $BaTiO_3$ | MgO | $Y_2O_3$ | $Mn_3O_4$ | $Cr_2O_3$ | $V_2O_5$ |
|---|---|---|---|---|---|---|
| X5R | 100 | 1.0 | 1.0 | 0.04 | 0.16 | 0.052 |
| X7R | 100 | 2.12 | 1.28 | 0.04 | 0.236 | 0.076 |

The ceramics shown in Table 1 were sintered at temperatures of 950° C. and 1,220° C.

TABLE 2

| | | 1 kHz | | 1 MHz | |
|---|---|---|---|---|---|
| | | Dielectric constant (k) | Capacitance (pF) | Dielectric constant (k) | Capacitance (pF) |
| | $BaTiO_3$ | 9.9 | 21 | 8.6 | 18 |
| 950° C. | X5R | 9.7 | 19.3 | 8.6 | 17.2 |
| | X7R | 8.8 | 18 | 7.84 | 16 |
| 1,220° C. | X5R | 9.6 | 20.5 | 8.62 | 18.4 |
| | X7R | 10.7 | 22.7 | 9.53 | 20.2 |

As can be seen from the data shown in Table 2, when the ceramics X5R and X7R for use in MLCCs were applied, the dielectric materials had lower dielectric constant values than the $BaTiO_3$ powder. These results reveal that the ceramic powders for use in MLCCs cannot be applied to polymer-ceramic dielectrics.

Figure 1:
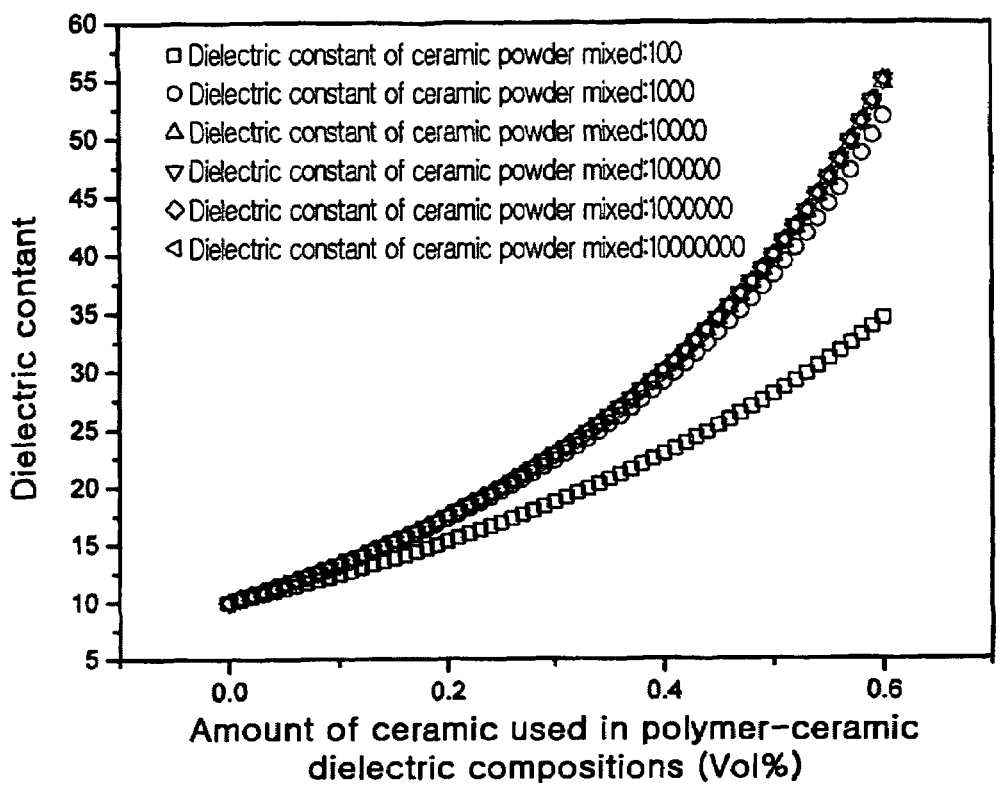
FIG. 1 is a graph showing simulation results of changes in the dielectric constant of polymer-ceramic dielectric compositions with varying dielectric constant of the ceramic in the dielectric compositions.
Figure 2:
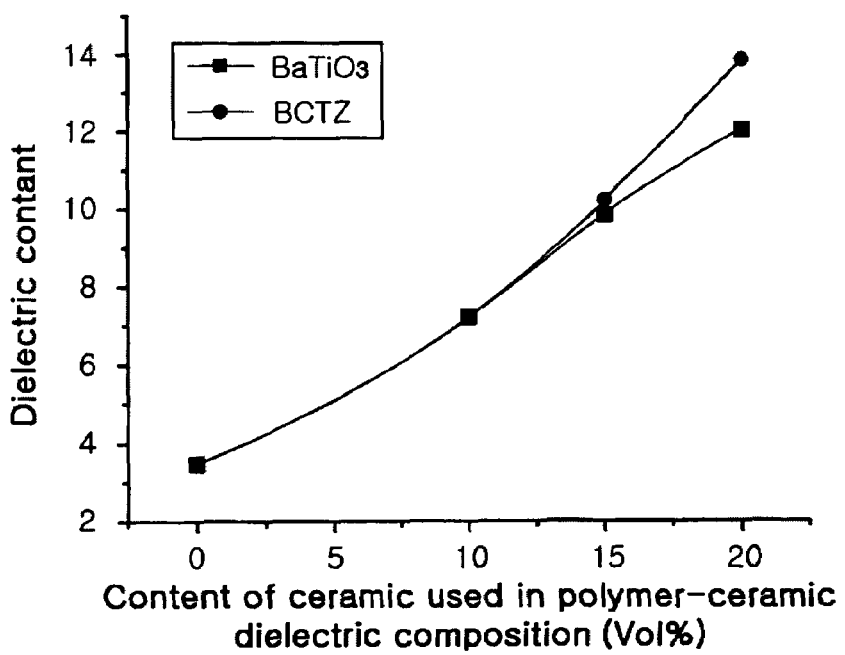
FIG. 2 is a graph showing changes in the dielectric constant of polymer-ceramic dielectric compositions, each of which comprises a $BaTiO_3$ ceramic powder and a BCTZ ceramic powder, with varying content of the ceramics.

FIG. 2 is a graph showing changes in the dielectric constant of polymer-ceramic dielectric compositions, each of which comprises a BaTiO$_3$ ceramic powder and a BCTZ ceramic powder (BaTiO$_3$+Ca+Zr), with varying content of the ceramics. The dielectric constant of the polymer-ceramic dielectric compositions increased with increasing amount of the ceramic powders. It is noted that although the BaTiO$_3$ ceramic powder had a higher dielectric constant than the BCTZ ceramic powder, there was no significant difference in the dielectric constant of the polymer-ceramic dielectric compositions. Particularly, the dielectric constant values of the polymer-ceramic dielectric compositions were substantially identical at 15 vol % or less of the ceramic powders.

From the above experimental results, it could be confirmed that high dielectric constant values of polymer-ceramic dielectric compositions could not be attained in terms of the design of ceramics for use in MLCCs.

BaTiO$_3$-based powders used in MLCCs are currently designed in terms of ionic polarization. Ti ions of BaTiO$_3$ migrate due to a shift between tetra-cubic phases, which takes place at 125° C., to induce ionic polarization, thus allowing the BaTiO$_3$ to have a dielectric constant. This ionic polarization is utilized in MLCCs. Other components for use in MLCCs function to form a core-shell structure, thus ensuring capacitance characteristics with varying temperature or shifting the Curie temperature.

U.S. Pat. No. 6,268,054 and U.S. Patent Publication No. 2002-0040085 state that metal oxides, such as Zr, Hf, Nb, Ca, La and Bi oxides, are included in a ceramic on the basis of enhancement imparted to the processing or properties of MLCCs. However, no improvement in the dielectric constant of polymer-ceramic dielectric compositions can be expected from the idea of the U.S. patents, and therefore, the content of the ceramic in the dielectric compositions is inevitably increased to a level of 60 to 95%.

Polarization is induced within the polymer-ceramic dielectric composition of the present invention, leading to an improvement in dielectric constant. Specifically, the polarization is induced at the interface between the polymer and the ceramic. The polarization induced at the interface between the polymer as an insulator and the ceramic causes the ceramic surface to be electrically charged. Since the surface of ceramics used in polymer-ceramic dielectrics developed hitherto is not electrically charged, no polarization is induced at the polymer/ceramic interface.

Polarization is a phenomenon caused by the rearrangement or displacement of electric charges due to an electric field. Polarization includes the following different mechanisms: ionic polarization, electronic polarization, orientational polarization (or dipolar polarization), and interfacial polarization (or space-charge polarization). The dielectric constant of decoupling capacitors in a low-frequency range can be greatly increased due to interfacial polarization. Interfacial polarization is a phenomenon that occurs at the interface between different dielectrics and is distinguished from polarization induced within dielectrics. Interfacial polarization is induced only when electric charges are generated at the interface between different materials. That is, electric charges are intentionally generated on the surface of ceramic particles to induce space-charge polarization at the polymer/ceramic interface, resulting in increased dielectric constant.

To generate electric charges on the surface of ceramic particles, impurities must be intentionally provided to the surface of the ceramic particles. For example, when an appropriate dopant element is added to a BaTiO$_3$ powder, Ti$^{3+}$ and electrons are generated to induce interfacial polarization. That is, the dopant metal must generate electric charges on the surface of the ceramic. To this end, the dopant metal is required to have a valence lower or higher than that of Ti.

Examples of suitable dopant metals that can combine with Ti include Nb having a valence of +5; Sb, La, Y and Mn having a valence of +3; and Mn having a valence of +2. Although Mn has a valence of +4 at room temperature but its valence is changed to +2 or +3 at high temperature. These metals are applied in the form of their oxides.

In the polymer-ceramic dielectric composition of the present invention, interfacial polarization is induced by allowing the surface of the ceramic to be electrically charged. The ceramic includes a material having a perovskite structure represented by ABO$_3$. Examples of such materials include BaTiO$_3$, PbTiO$_3$, PbZrO$_3$, Pb(Ti,Zr)O$_3$, Pb(Mn, Nb)O$_3$, SrTiO$_3$, CaTiO$_3$, and MgTiO$_3$.

Inclusion of a metal oxide dopant in the ceramic allows the surface of the ceramic to be electrically charged. The metal of the metal oxide dopant is selected from metals having a different valence from the B site element of the ABO$_3$. It is preferred that the metal have a higher valence than the B site element. If the B site element has a valence of +4 like Ti and Zr, the metal of the metal oxide dopant is Nb having a valence of +5 or Sb, Y or La having a valence of +3. Most preferred is a metal having a different valence from the B site element and an atomic radius similar to that of the B site element so as to facilitate replacement between the metal and the B site element.

The B site element of the ABO$_3$ is replaced by the metal of the metal oxide dopant to electrically charge the ceramic surface. The suitability of the replacement can be determined by measuring the electrical conductivity of the ceramic or by measuring the dielectric constant of the polymer-ceramic dielectric composition over the entire frequency ranges to identify whether or not a sudden increase in dielectric constant is observed in a low-frequency range of 1 kHz or less.

Figure 3:
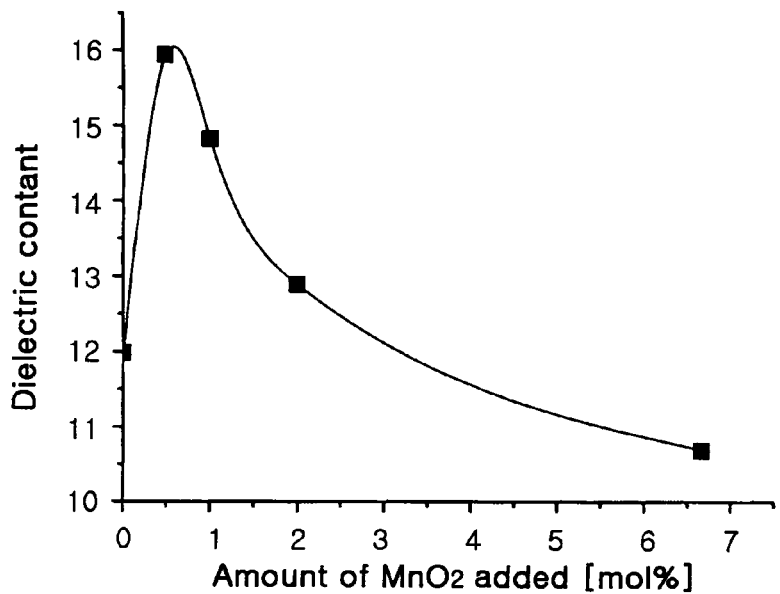
FIG. 3 is a graph showing changes in the dielectric constant of a ceramic composed of $BaTiO_3$ and $MnO_2$ as a metal oxide dopant with varying content of the metal oxide dopant.

FIG. 3 shows changes in the dielectric constant of a polymer-ceramic dielectric composition comprising a ceramic composed of BaTiO$_3$ and MnO$_2$ with varying content of the MnO$_2$. At this time, the dielectric composition comprises 20 vol % of the ceramic and the balance of a polymer.

The graph of FIG. 3 shows that the dielectric constant increases with increasing content of the MnO$_2$ and begins to rapidly decrease from 2 mol % of the MnO$_2$. The MnO$_2$ is added to allow the ceramic surface to be electrically charged. Since preferred amount of electric charges present on the ceramic surface is limited to ensure a high dielectric constant of the dielectric composition according to the present invention, preferred content of the metal oxide dopant is also limited.

The surface of the ceramic of the polymer-ceramic dielectric composition according to the present invention is electrically charged to induce interfacial polarization, leading to an increase in dielectric constant. In contrast, the surface of ceramics of conventional polymer-ceramic dielectric compositions is not electrically charged.

In the polymer-ceramic dielectric composition of the present invention, the kind of the material represented by ABO$_3$ is determined, the metal having a different valence from the B site element of the ABO$_3$ is selected, and the metal oxide is added to electrically charge the ceramic surface, thereby inducing interfacial polarization. Whether the ceramic surface is electrically charged or not can be confirmed by measuring the electrical conductivity or by measuring the dielectric constant of the polymer-ceramic dielectric composition with varying frequency and observing a sudden change in a low-frequency range. According to experiments conducted in the present invention, when the metal oxide dopant was added, an increase in dielectric constant was about 34% to about 49% in a low-frequency range of 1 kHz or less.

The polymer-ceramic dielectric composition of the present invention will be explained with reference to the use of Nb oxide as the metal oxide dopant, but is not limited thereto.

Since the B site element of $BaTiO_3$ has a valence of +4 and Nb has a valence of +5, NbO can be used as a metal oxide dopant. In addition, since Ti has an atomic radius similar to that of Nb, it can be easily replaced by Nb.

When Nb oxide is added in an amount of 0.05 to 2 mol % and preferably 0.25 to 0.75 mol %, the dielectric constant of the dielectric composition is highest. If the amount of the Nb oxide added is too small, an increase in dielectric constant is negligible. Accordingly, it is preferred that the lower content of the Nb oxide be limited to 0.05 mol %. Meanwhile, if the amount of the Nb oxide is too large, polarization is greatly induced, thus resulting in an increase in both dielectric constant and dielectric loss and a deterioration in TCC properties that indicate changes in dielectric constant with varying temperature. Accordingly, it is preferred that the upper content of the Nb oxide be limited to 2 mol %.

In the case where Nb oxide is added to $BaTiO_3$, the content range of the Nb oxide must be narrowed and an increase in dielectric constant by the addition of the Nb oxide must be raised. To meet these requirements, the ceramic further includes Ca oxide. Ca oxide serves to increase the thickness of the interface barriers so that an increase in the dielectric constant of the polymer-ceramic dielectric composition can be maximized.

At this time, it is preferred that the ratio Nb oxide/Ca oxide be in the range of 1.3 to 4. When the ratio Nb oxide/Ca oxide is less than 1.3 or exceeds 4, an increase in dielectric constant is insignificant, compared to when no Ca oxide is added.

The ceramic powder may be calcined at 800 to 1,400° C. and/or sintered at 1,000° C. or higher before use. An increase in dielectric constant can be achieved even when the ceramic powder is calcined.

The polymer-ceramic dielectric composition of the present invention preferably comprises 10 to 70 vol % of the ceramic and the balance of the polymer. Less than 10 vol % of the ceramic makes it difficult to attain a sufficiently high dielectric constant. Meanwhile, more than 70 vol % of the ceramic may result in poor peel strength, causing a problem in terms of reliability. As the content of the ceramic in the polymer-ceramic dielectric composition according to the present invention increases, the electrical properties of the dielectric composition are improved. According to the dielectric composition of the present invention, the dielectric constant of the ceramic can be increased due to interfacial polarization, thus avoiding the need for excessively increasing the ceramic content. Thus, the dielectric composition of the present invention has an advantage in that the ceramic content is limited to the range of 15 to 55 vol % and preferably 15 to 50 vol %.

Any polymer that is used to produce embedded capacitors may be used in the dielectric composition of the present invention. The polymer used in the dielectric composition of the present invention is selected from the group consisting of epoxy, polyimide, polycarbonate, polyethylene, polyethylene terephthalate, polypropylene, polystyrene, polyphenylene oxide, polyester, polyamide, and mixtures thereof.

The present invention also provides an embedded capacitor using the dielectric composition. The embedded capacitor of the present invention comprises a first electrode film, a second electrode film and a dielectric layer wherein the dielectric layer is formed using the polymer-ceramic dielectric composition.

Any conductive metal that is applied to capacitors may be used to form the first and second electrode films, and examples thereof include Pt, Au, Ag, Cu, Ni and Pd. The electrode films preferably have a thickness of 0.1 to 100 μm.

The embedded capacitor of the present invention is produced by the following procedure. First, a slurry of the polymer-ceramic dielectric composition according to the present invention is applied to a metal electrode foil and cured to form a laminate. The application is preformed by casting, e.g., tape casting. Thereafter, another metal electrode foil is pressed on the laminate to produce a capacitor.

Alternatively, the polymer-ceramic dielectric composition of the present invention is formed on two metal foils to obtain two laminates. The two laminates are pressed in such a manner that the surfaces, on which the dielectric composition is formed, are arranged to face to each other, to produce a capacitor. The polymer-ceramic dielectric composition of the present invention may have a high dielectric constant without the need for increasing the ceramic content to 60% or more, thereby ensuring good adhesion of the dielectric layer to the metal foils.

The present invention also provides a printed circuit board having the capacitor embedded therein.

The capacitor is embedded in the printed circuit board by laminating the capacitor on a polymer substrate. As taught in the methods suggested in U.S. Pat. Nos. 5,079,069, 5,261,153 and 5,800,575 by Sanmina, U.S.A., a core polymer can also be used as a dielectric layer of a capacitor.

Hereinafter, the present invention will be explained in more detail with reference to the following examples.

EXAMPLES

Example 1

Ceramic powders were prepared in accordance with the compositions (Inventive Ceramics 1 to 6) indicated in Table 3. Each of the ceramic powders was ball-milled and mixed for 12 hours using ethanol as a solvent and zirconia balls. The mixture was dried at 200° C. for 12 hours, calcined and/or baked. The calcination was performed by heating the mixture at a rate of 5° C./min., maintaining at the final temperature for 2 hours, and cooled. The thermally treated mixture was pulverized using ethanol as a solvent and zirconia balls for 24 hours, and dried at 200° C.

The dried ceramic powder was mixed with 20 vol % of a bisphenol A resin (epoxy type). Specifically, the mixing was carried out by mixing a bisphenol A resin, dicyanoguanidine as a curing agent and Re 610 as a dispersant together in acetone, and blending the mixture blended with the ceramic powder to prepare a slurry. At this time, the ratio of the bisphenol A resin and the curing agent was adjusted to 62:8.5 (w/w), and the dispersant was used in an amount of 0.01 vol % with respect to the total volume of the slurry composition. A $BaTiO_3$ powder (Conventional Ceramic 1) was mixed with a bisphenol A resin, as in Inventive Examples 1.

The slurry was applied to a thickness of 100 μm to a copper plate having a thickness of 35 μm, and cured at 170° C. for 20 minutes to form a dielectric layer. Electrodes were formed on both surfaces of the dielectric layer to produce a capacitor. Thereafter, the dielectric constant and the dielectric loss of the dielectric layer were measured using an impedance analyzer (HP4294A) at 1 kHz in accordance with IPC-TM-650. The results are shown in Table 3.

TABLE 3

| Ceramic No. | Amount of NbO (mol %) | Amount of BaTiO$_3$ (mol %) | Calcining temp. (° C.) | Baking temp. (° C.) | Dielectric constant | Loss coefficient (Df) |
|---|---|---|---|---|---|---|
| Conventional Ceramic 1 | 0 | 100 | 1100 | — | 13 | 0.05 |
| Inventive Ceramic 1 | 0.25 | 100 | 1100 | — | 15.5 | 0.092 |
| Inventive Ceramic 2 | 0.5 | 100 | 1100 | — | 16.4 | 0.088 |
| Inventive Ceramic 3 | 0.75 | 100 | 1100 | — | 16.2 | 0.107 |
| Inventive Ceramic 4 | 0.25 | 100 | 1100 | 1350 | 15 | 0.094 |
| Inventive Ceramic 5 | 0.5 | 100 | 1100 | 1350 | 15.7 | 0.092 |
| Inventive Ceramic 6 | 0.75 | 100 | 1100 | 1350 | 17.3 | 0.128 |

As is evident from Table 3, the addition of the Nb oxide contributed to an improvement in the dielectric constant and dielectric loss coefficient of the dielectric compositions. A combination of calcination and baking led to improved electrical properties of the dielectric compositions, compared to calcination alone.

Figure 4:
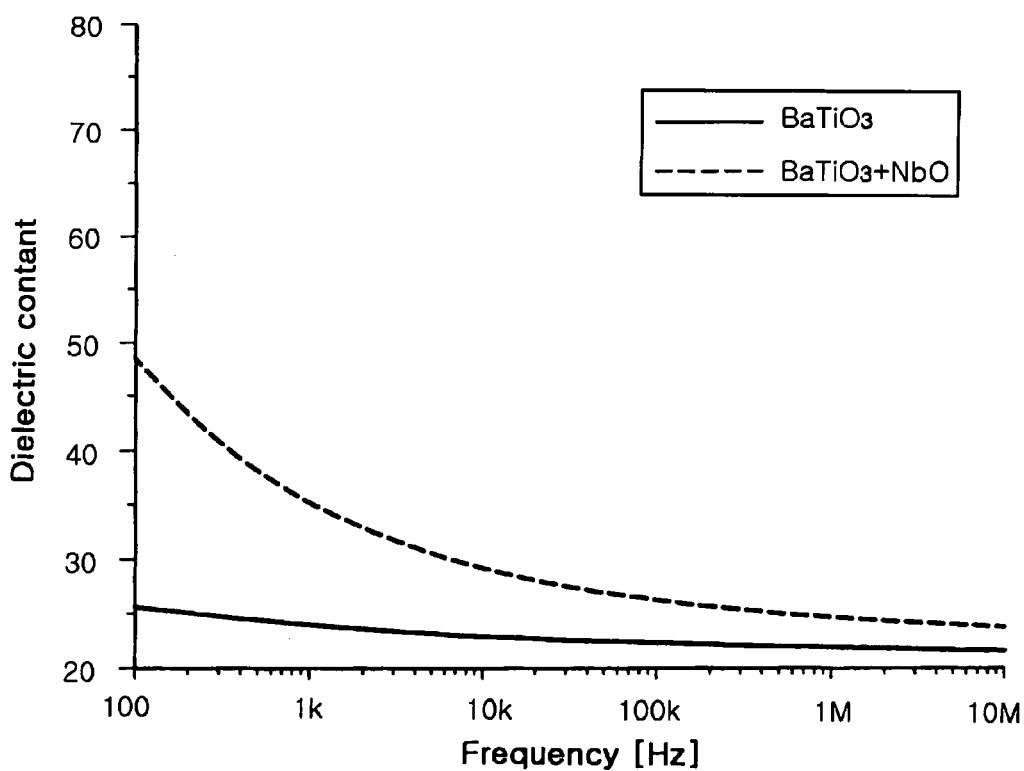
FIG. 4 is a graph showing changes in the dielectric constant of a $BaTiO_3$ powder and a ceramic composed of a $BaTiO_3$ powder and NbO with varying frequency.

FIG. 4 shows dielectric constant values of Conventional Ceramic 1 and Inventive Ceramic 2 with varying frequency. The graph of FIG. 4 indicates that the addition of NbO to BaTiO$_3$ resulted in an increase in dielectric constant over the entire frequency ranges, particularly in a low-frequency range. An increase in dielectric constant was about 34% to about 49%, as calculated in a low-frequency range of 1 kHz or less. Taking into consideration the fact that interfacial polarization results in a rapid increase in dielectric constant in a low-frequency range, it was concluded that interfacial polarization was induced by the addition of the NbO, and as a result, the surface of the ceramic was electrically charged.

Example 2

The procedure of Example 1 was repeated, except that CaO was further added to the ceramics, the calcined materials were pulverized so as to have an average particle diameter of about 1 μm, and the resulting powders were blended with 44 vol % of the resin.

TABLE 4

| Ceramic No. | Amount of NbO (mol %) | Amount of CaO (mol %) | Amount Of BaTiO$_3$ (mol %) | Calcining temp. (° C.) | Dielectric constant | Loss coefficient (Df) |
|---|---|---|---|---|---|---|
| Conventional Ceramic 1 | 0 | 0 | 100 | 1100 | 22 | 0.05 |
| Inventive Ceramic 7 | 2 | 2 | 100 | 1100 | 19.9 | 0.03 |
| Inventive Ceramic 8 | 3 | 2 | 100 | 1100 | 43.7 | 0.09 |
| Inventive Ceramic 9 | 4 | 2 | 100 | 1100 | 26.2 | 0.02 |
| Inventive Ceramic 10 | 8 | 2 | 100 | 1100 | 26.1 | 0.02 |

The results of Table 4 reveal that the addition of the Nb oxide and the Ca oxide caused a great increase in the dielectric constant of the dielectric compositions.

Although the present invention has been described herein with reference to the foregoing embodiments, these embodiments do not serve to limit the scope of the present invention. All modifications having substantially the same constitution and the same operation and effects as the technical spirit of the present invention as disclosed in the accompanying claims are considered to be within the scope of the present invention. For example, BaTiO$_3$ was used as the material represented by ABO$_3$ in Examples 1 and 2, but other types of ABO$_3$ may be used in the present invention. In addition, Nb having a valence of +5 was used to electrically charge the ceramic surface, but other metal oxide dopants, e.g., Mn, may be used in the present invention.

As apparent from the above description, according to the polymer-ceramic dielectric composition of the present invention, the surface of the ceramic is electrically charged to induce polarization at the polymer/ceramic interface, resulting in an increase in dielectric constant. A high dielectric constant of the dielectric composition according to the present invention can be attained without the need for increasing the ceramic content. Therefore, the dielectric composition of the present invention is highly useful in the fabrication of printed circuit boards.

What is claimed is:

1. A polymer-ceramic dielectric composition comprising a polymer and a ceramic dispersed in the polymer,
   wherein the ceramic is composed of a material having a perovskite structure represented by ABO$_3$ and a metal oxide dopant,
   wherein the metal oxide dopant comprises a metal having an atomic radius similar to that of the B site element and replaced with the B site element whereby the surface of the ceramic is electrically charged.

2. The dielectric composition according to claim 1, wherein the metal of the metal oxide dopant has a different valence from the B site element of the ABO$_3$.

3. The dielectric composition according to claim 1, wherein the metal oxide dopant increases the dielectric constant of the ABO$_3$ by 34% to 49% in a low-frequency range of 1 kHz or less.

4. The dielectric composition according to claim 1, wherein the ABO$_3$ is selected from the group consisting of BaTiO$_3$, PbTiO$_3$, PbZrO$_3$, Pb(Ti,Zr)O$_3$, SrTiO$_3$, CaTiO$_3$, MgTiO$_3$, and mixtures thereof.

5. The dielectric composition according to claim 4, wherein the metal oxide dopant is selected from the group consisting of Nb, Sb, La, Y and Mn oxides.

6. The dielectric composition according to claim 5, wherein the metal oxide dopant is Nb oxide and is added in an amount of 0.05 to 2 mol %.

7. The dielectric composition according to claim 6, wherein the metal oxide dopant is Nb oxide and is added in an amount of 0.05 to 10 mol %; and 0.05 to 10 mol % of Ca oxide is added as another metal oxide dopant.

8. The dielectric composition according to claim 7, wherein the ratio Nb oxide/Ca oxide is from 1.3 to 4.

9. The dielectric composition according to claim 7, wherein the ceramic is primarily calcined at 800 to 1,400° C.

10. The dielectric composition according to claim 7, wherein the ceramic is primarily calcined at 800 to 1,400° C. and baked at 1,000° C. or higher.

11. The dielectric composition according to claim 1, wherein the ABO$_3$ is BaTiO$_3$.

12. The dielectric composition according to claim 1, wherein the polymer-ceramic dielectric composition comprises 10 to 70 vol % of the ceramic and the balance of the polymer.

13. The dielectric composition according to claim 1, wherein the polymer-ceramic dielectric composition comprises 15 to 55 vol % of the ceramic and the balance of the polymer.

14. The dielectric composition according to claim 13, wherein the dielectric composition has a dielectric constant of 26 to 45 at a frequency of 1 kHz.

15. The dielectric composition according to claim 1, wherein the polymer is selected from the group consisting of epoxy, polyimide, polycarbonate, polyethylene, polyethylene terephthalate, polypropylene, polystyrene, polyphenylene oxide, polyester, polyamide, and mixtures thereof.

16. An embedded capacitor comprising
a first electrode film, a second electrode film and a dielectric layer wherein the dielectric layer is formed of a polymer-ceramic dielectric composition comprising a polymer and a ceramic dispersed in the polymer, and the ceramic is composed of a material having a perovskite structure represented by $ABO_3$ and a metal oxide dopant wherein the metal oxide dopant comprises a metal having an atomic radius similar to that of the B site element and replaced with the B site element whereby the surface of the ceramic is electrically charged.

17. The embedded capacitor according to claim 16, wherein the metal of the metal oxide dopant has a different valence from the B site element of the $ABO_3$.

18. The embedded capacitor according to claim 16, wherein the metal oxide dopant increases the dielectric constant of the $ABO_3$ by 34% to 49% in a low-frequency range of 1 kHz or less.

19. The embedded capacitor according to claim 16, wherein the $ABO_3$ is selected from the group consisting of $BaTiO_3$, $PbTiO_3$, $PbZrO_3$, $Pb(Ti,Zr)O_3$, $SrTiO_3$, $CaTiO_3$, $MgTiO_3$, and mixtures thereof.

20. The embedded capacitor according to claim 19, wherein the metal oxide dopant is selected from the group consisting of Nb, Sb, La, Y and Mn oxides.

21. The embedded capacitor according to claim 20, wherein the metal oxide dopant is Nb oxide and is added in an amount of 0.05 to 2 mol %.

22. The embedded capacitor according to claim 20, wherein the metal oxide dopant is Nb oxide and is added in an amount of 0.05 to 10 mol %; and 0.05 to 10 mol % of Ca oxide is added as another metal oxide dopant.

23. The embedded capacitor according to claim 22, wherein the ratio Nb oxide/Ca oxide is from 1.3 to 4.

24. The embedded capacitor according to claim 22, wherein the ceramic is primarily calcined at 800 to 1,400° C.

25. The embedded capacitor according to claim 22, wherein the ceramic is primarily calcined at 800 to 1,400° C. and baked at 1,000° C. or higher.

26. The embedded capacitor according to claim 16, wherein the $ABO_3$ is $BaTiO_3$.

27. The embedded capacitor according to claim 16, wherein the polymer-ceramic dielectric composition comprises 10 to 70 vol % of the ceramic and the balance of the polymer.

28. The embedded capacitor according to claim 16, wherein the polymer-ceramic dielectric composition comprises 15 to 55 vol % of the ceramic and the balance of the polymer.

29. The embedded capacitor according to claim 28, wherein the dielectric composition has a dielectric constant of 26 to 45 at a frequency of 1 kHz.

30. The embedded capacitor according to claim 16, wherein the polymer is selected from the group consisting of epoxy, polyimide, polycarbonate, polyethylene, polyethylene terephthalate, polypropylene, polystyrene, polyphenylene oxide, polyester, polyamide, and mixtures thereof.

31. A printed circuit board comprising a capacitor embedded therein wherein the capacitor comprises a first electrode film, a second electrode film and a dielectric layer, the dielectric layer is formed of a polymer-ceramic dielectric composition comprising a polymer and a ceramic dispersed in the polymer, and the ceramic is composed of a material having a perovskite structure represented by $ABO_3$ and a metal oxide dopant wherein the metal oxide dopant comprises a metal having an atomic radius similar to that of the B site element and replaced with the B site element whereby the surface of the ceramic is electrically charged.

32. The printed circuit board according to claim 31, wherein the metal of the metal oxide dopant has a different valence from the B site element of the $ABO_3$.

33. The printed circuit board according to claim 31, wherein the metal oxide dopant increases the dielectric constant of the $ABO_3$ by 34% to 49% in a low-frequency range of 1 kHz or less.

34. The printed circuit board according to claim 31, wherein the $ABO_3$ is selected from the group consisting of $BaTiO_3$, $PbTiO_3$, $PbZrO_3$, $Pb(Ti,Zr)O_3$, $SrTiO_3$, $CaTiO_3$, $MgTiO_3$, and mixtures thereof.

35. The printed circuit board according to claim 34, wherein the metal oxide dopant is selected from the group consisting of Nb, Sb, La, Y and Mn oxides.

36. The printed circuit board according to claim 34, wherein the ceramic is primarily calcined at 800 to 1,400° C.

37. The printed circuit board according to claim 34, wherein the ceramic is primarily calcined at 800 to 1,400° C. and baked at 1,000° C. or higher.

38. The printed circuit board according to claim 31, wherein the $ABO_3$ is $BaTiO_3$.

39. The printed circuit board according to claim 38, wherein the metal oxide dopant is Nb oxide and is added in an amount of 0.05 to 2 mol %.

40. The printed circuit board according to claim 39, wherein the metal oxide dopant is Nb oxide and is added in an amount of 0.05 to 10 mol %; and 0.05 to 10 mol % of Ca oxide is added as another metal oxide dopant.

41. The printed circuit board according to claim 40, wherein the ratio Nb oxide/Ca oxide is from 1.3 to 4.

42. The printed circuit board according to claim 31, wherein the polymer-ceramic dielectric composition comprises 10 to 70 vol % of the ceramic and the balance of the polymer.

43. The printed circuit board according to claim 31, wherein the polymer-ceramic dielectric composition comprises 15 to 55 vol % of the ceramic and the balance of the polymer.

44. The printed circuit board according to claim 43, wherein the dielectric composition has a dielectric constant of 26 to 45 at a frequency of 1 kHz.

45. The printed circuit board according to claim 31, wherein the polymer is selected from the group consisting of epoxy, polyimide, polycarbonate, polyethylene, polyethylene terephthalate, polypropylene, polystyrene, polyphenylene oxide, polyester, polyamide, and mixtures thereof.

* * * * *